(12) United States Patent
Chien et al.

(10) Patent No.: US 7,449,962 B2
(45) Date of Patent: Nov. 11, 2008

(54) PHASE-CONTROLLED CURRENT SOURCE FOR PHASE-LOCKED LOOP

(75) Inventors: Ting-Hsu Chien, Yi-Lang (TW); Chi-Sheng Lin, Taichung (TW)

(73) Assignee: National Applied Research Laboratories, Taipei (TW)

( * ) Notice: Subject to any disclaimer, the term of this patent is extended or adjusted under 35 U.S.C. 154(b) by 73 days.

(21) Appl. No.: 11/523,637

(22) Filed: Sep. 20, 2006

(65) Prior Publication Data
US 2008/0129389 A1    Jun. 5, 2008

(51) Int. Cl.
*H03L 7/085* (2006.01)
(52) U.S. Cl. .............................. 331/16; 331/25; 327/2; 327/3; 327/5; 327/7; 327/12; 327/40
(58) Field of Classification Search .................. 331/16, 331/25; 327/2, 3, 5, 7, 12, 40
See application file for complete search history.

(56) References Cited

U.S. PATENT DOCUMENTS

| | | | |
|---|---|---|---|
| 5,440,274 A | * | 8/1995 | Bayer .......................... 331/1 A |
| 5,631,582 A | * | 5/1997 | Fujikawa ...................... 327/12 |
| 6,011,822 A | * | 1/2000 | Dreyer ........................ 375/376 |
| 6,803,753 B2 | * | 10/2004 | Lu ........................... 324/76.52 |
| 6,856,202 B2 | * | 2/2005 | Lesso ......................... 331/1 A |

\* cited by examiner

*Primary Examiner*—Robert J. Pascal
*Assistant Examiner*—Levi Gannon
(74) *Attorney, Agent, or Firm*—Birch, Stewart, Kolasch & Birch, LLP

(57) ABSTRACT

A phase-controlled current source for phase-locked loop is provided. The phase-locked loop includes a voltage-controlled oscillator to associate a charging path or discharging path in order to generate an output signal and the output signal is further sensed so as to generate a loop signal. The phase-controlled current source includes a status memory receiving the loop signal and the reference signal so as to output an energy-triggering/energy-removing signal; and a controllable current source, under the control by energy-triggering/energy-removing signal so as to decide whether a charging and discharging action should be performed, wherein after the charging action or discharging action is decided, the charging path or the discharging path is generated through the reference signal and the loop signal.

20 Claims, 7 Drawing Sheets

PHASE-CONTROLLED CURRENT SOURCE FOR PHASE-LOCKED LOOP

BACKGROUND OF THE INVENTION

1. Filed of the Invention

This invention relates a phase-locked loop, it specifically relates to phase-controlled current source of a phase-locked loop and it has characteristic of controlling output signal by phase for charging/discharging current.

2. Prior art

Phase-Locked Loop (PLL) is commonly used in current communication system or other high frequency technological field, for example: 1800 MHz in Global Standard for Mobile (GSM), 5.2 GHz for IEEE802.11A and 10 GHz for Ultra-Wideband (UWB), etc.; its major function is to modulate data, video and audio information into high frequency to facilitate subsequent signal reception and transmission.

The basic function of phase-locked loop is to synchronize a loop signal and an externally added reference signal, its basic principle is to use a Phase Frequency Detector (PFD) to provide rising and descending impulse signal to a Charge Pump (CP) so as to display whether the frequency has to be raised or lowered. Then, charge pump will provide a charging or discharging path which passes through a Loop Filter (LF) and will be sent into a voltage-controlled oscillator (VCO). The output end of the voltage-controlled oscillator is connected to phase frequency detector in order to generate a feedback loop so as to ensure the locking between output frequency and input reference frequency. Among them, loop signal and reference signal can be sine wave or square wave signal; however, the rising and descending signals provided by phase frequency detector are impulse signals. In the prior art phase-locked loop, after loop signal and reference signals are connected to phase frequency detector, feedback path method is used to let phase frequency detector provide impulse signal in order to control the charging or discharging of charge pump, however, since the conventional feedback path method has longer signal feedback delay time, detection dead zone issue thus could be easily generated, meanwhile, it is not suitable to be applied in the high operation frequency field. When detection dead zone occurs, phase frequency detector can not distinguish frequency or phase difference, therefore, it can not drive charge pump.

In order to prevent the happening of detection dead zone, delay component is used in the feed back path of phase frequency detector in the prior art so as to provide the minimum rising/descending impulse width needed by the charge pump so that there will be no difficulty for the output of charging and discharging current in the charge pump due to small impulse width. However, process can not predict precisely the delay time, charging and discharging will thus occur in the same time in the charge pump and too much surges will also occur in the same time. Additionally, the delay component will also limit the frequency comparison range of phase frequency detector.

SUMMARY OF THE INVENTION

An embodiment of the current invention is a phase-controlled current source of phase-locked loop, the phase-locked loop comprises of a voltage-controlled oscillator to associate a charging path or discharging path in order to generate an output signal and the output signal is further sensed so as to generate a loop signal, then, together with a reference signal, these signals are used to control phase-controlled current source. Phase-controlled current source comprises of a status memory and a controllable current source and the status memory receives reference signal and loop signal in order to generate an energy-triggering/energy-removing signal, controllable current source then follows the energy-triggering/energy-removing signal to decide if to perform charging or discharging behavior; after charging or discharging behavior is decided, loop signal will decide the charging path or discharging path for the controllable current source based on reference signal so as to perform charging or discharging behavior.

DETAILED DESCRIPTIONS OF THE PREFERRED EMBODIMENT

A phase-controlled current source for phase-locked loop is proposed in the current invention. The major difference between it and the conventional phase-locked loop is to design a phase frequency detector and charge pump function in the same structure, that is, phase-controlled current source, it has the characteristic of controlling the output charging and discharging current by phase. It is achieved through a status memory and a controllable current source serially connected to the high and low voltage side, therefore, the conventional detection dead zone issue of prior art phase-locked loop is eliminated. Additionally, since it has simple structure and no feedback mechanism is needed, it can thus be used in high frequency operation.

FIG. 1 shows an illustration of the basic structure of phase-locked loop 1 of the current invention. Phase-locked loop 10 comprises of a phase-controlled current source 12, a loop filter 14, a voltage-controlled oscillator 16 and a feedback circuit 18. Phase-controlled current source 12 compares a reference signal $S_{ref}$ and a loop signal $S_{fb}$ so as to provide a charging path or a discharging path to voltage-controlled oscillator 16 so as to let the output signal $S_{out}$ of voltage-controlled oscillator 16 rise or descend. Among them, reference signal $S_{ref}$ is a sine wave signal generated by a quartz oscillator so as to be used as reference frequency of phase-locked loop 10 and the loop signal $S_{fb}$ is the sine wave signal or square wave signal generated through the sensing of output signal $S_{out}$ by feedback circuit 18. Feedback circuit 18 can generally be frequency divider and loop filter 14 is generally used to ensure the stability of the entire circuit. What is emphasized in the current invention is the phase-controlled current source 12 composed of status memory and controllable current source, its major difference with the phase frequency detector of prior art phase-locked loop and charge pump will be described as in the followings.

FIG. 2 shows a basic structure illustration of the phase-controlled current source of the current invention. Phase-controlled current source 12 comprises of a status memory 20 and a controllable current source 22 so as to provide charging path or discharging path for voltage-controlled oscillator 16. Status memory 20 is connected to loop signal $S_{fb}$ and reference signal $S_{ref}$ so as to output an energy-triggering/energy-removing signal $S_{con}$, energy-triggering/energy-removing signal $S_{con}$ is then connected to controllable current source 22 so as to decide whether controllable current source 22 should perform a charging or discharging action. After the charging and discharging actions are decided, controllable current source 22 will then generate charging or discharging path based on reference signal $S_{ref}$ and loop signal $S_{fb}$. In other words, during the generation of the generation of charging or discharging path, controllable current source 22 will be directly involved in the control of reference signal $S_{ref}$ and loop $S_{fb}$ and the control does not have to pass through status memory 20, as compared to conventional phase-locked loop, this can enhance operation frequency and improve the issue of detection dead zone.

Since phase-controlled current source 12 uses first the energy-triggering/energy-removing signal $S_{con}$ to decide whether controllable current source 22 should perform charging or discharging action, therefore, after controllable current source 22 has decided the charging or discharging action, the circuit of status memory 20 will temporarily need not to be used and the charging or discharging behavior of controllable current source can then be decided by loop signal $S_{fb}$ and reference signal $S_{ref}$, hence, the circuit operation frequency can be enhanced and the detection dead zone issue can be improved. Here, the charging or discharging behavior of controllable current source means that controllable current source will generate first charging or discharging path and then charging or discharging behavior will be based on it.

The energy-triggering/energy-removing signal $S_{con}$ outputted by status memory 20 is not equal to the rising or descending impulse signal of phase frequency detector in the prior art and the major function of energy-triggering/energy-removing signal $S_{con}$ is to decide whether controllable current source 22 should perform charging and discharging action, then, after deciding to perform charging or discharging action, loop signal $S_{fb}$ and reference signal $S_{ref}$ will decide charging or discharging path, however, the rising and descending impulse signals provided by phase frequency detector of the prior art are to fully control the charging or discharging path of charge pump, this is the major difference.

FIG. 3 is the circuit diagram of phase-controlled current source of the current invention. FIG. 3 is an embodiment proposed based on the basic structure illustrated in FIG. 2. Status memory 20 includes many serially connected switches, the order is a first switch 24, a second switch 26, a third switch 28 and a fourth switch 30 and a first inverter 32, first switch 24 and second switch 26 can be PMOS switch, third switch 28 and fourth switch 30 can be NMOS switch.

First switch 24 is connected between high voltage side VDD and second switch 26, second switch 26 is connected between first switch 24 and a node Y and node Y is the input end of first inverter 32, third switch 28 is however connected between node Y and fourth switch 30 and fourth switch 30 is connected between third switch 28 and low voltage side GND, first switch 24 and third switch 28 are controlled by reference signal $S_{ref}$, second switch 26 and fourth switch 30 are controlled by loop signal $S_{fb}$. To respond to the control of reference signal $S_{ref}$ and loop signal $S_{fb}$, first switch 24, second switch 26, third switch 28 and fourth switch 30 are going to conduct or non-conduct, and then an energy-triggering/energy-removing signal $S_{con}$ is sent through first inverter 32.

Controllable current source 22 include many serially connected switches connected between high voltage side VDD and low voltage side GND, the order is: a fifth switch 34, a sixth switch 36, a seventh switch 38 and an eighth switch 40. Loop filter 14 is connected between sixth switch 36 and seventh switch 38, fifth switch 34 and sixth switch 36 can be PMOS switch, seventh switch 38 and eighth switch 40 can be NMOS switch. Fifth switch 34 is controlled by inverse reference signal $S_{ref}$, that is, reference signal $S_{ref}$ is connected to a second inverter 42 so as to control the conducting or non-conducting of fifth switch 34. Sixth switch 36 and seventh switch 38 are controlled respectively by energy-triggering/energy-removing signal $S_{con}$ and inverse energy-triggering/energy-removing signal $S_{con}$, that is, sixth switch 36 is connected to energy-triggering/energy-removing signal $S_{con}$, and a third inverter 44 is added between energy-triggering/energy-removing signal $S_{con}$ and seventh switch 38. Eighth switch 40 is however controlled by loop signal $S_{fb}$.

Based on the basic structure spirit of FIG. 2, that is, status memory 20 will output an energy-triggering/energy-removing signal $S_{con}$ to decide whether controllable current source 22 should perform charging and discharging action, then loop signal $S_{fb}$ and reference signal $S_{ref}$ is used to decide the charging or discharging path of controllable current source 22. The electrical circuit design of status memory and controllable current source can be realized in different ways than that of FIG. 3.

FIG. 4A to FIG. 4D are the action electrical circuit diagram of phase-controlled current source of the current invention, FIG. 4A to FIG. 4D are used to further describe the action of phase-controlled current source of the current invention.

As shown in FIG. 4A, it is a preparation action for pre-charging or pre-discharging of phase-controlled current source 12. In this action, reference signal $S_{ref}$ and loop signal $S_{fb}$ will conduct first switch 24 and second switch 26 respectively and turn off third switch 28 and fourth switch 30, therefore, the node Y of second switch 26 and third switch 28 will be at the potential of high voltage side VDD. Then an energy-triggering/energy-removing signal $S_{con}$ will be generated by first inverter 32, at this moment, energy-triggering/energy-removing signal $S_{con}$ will conduct sixth switch 36, and an inverse energy-triggering/energy-removing signal $S_{con}$ will be generated through third inverter 44 to conduct seventh switch 38.

Moreover, according to the above descriptions, fifth switch 34 and first switch 24 are all PMOS switches, therefore, when reference signal $S_{ref}$ conducts first switch 24, inverse reference signal $S_{ref}$ will then turn off fifth switch 34, however, since eighth switch 40 and fourth switch 30 are all NMOS switches, therefore, when loop signal $S_{fb}$ turns off fourth switch 30, eighth switch 40 will then be turned off by the control of loop signal $S_{fb}$.

Since fifth switch 34 and eighth switch 40 are all closed at the same time, therefore, during the preparation action of FIG. 4A, phase-controlled current source 12 will not provide charging or discharging path to voltage-controlled oscillator 16 for performing charging or discharging action, however, at this stage, the potential of node Y will be locked at the potential of high voltage side VDD, therefore, sixth switch 36 and seventh switch 38 will remain conducting by the control of reference signal $S_{ref}$. After the completion of the preparation action of phase-controlled current source 12, the next thing is to perform actions in FIG. 4B for FIG. 4C so as to provide charging path or discharging path to voltage-controlled oscillator 16 to perform charging or discharging actions.

FIG. 4B is the electrical diagram for charging action of phase-controlled current source 12. When reference signal $S_{ref}$ controls first switch 24, third switch 28 will conduct and loop signal $S_{fb}$ will keep second switch 26 conducting and fourth switch 30 non-conducting, therefore, the potential of node Y will be kept at the potential of high voltage side VDD and sixth switch 36 and seventh switch 38 will be remained at the status of preparation action and conducting. Here fifth switch 34 and first switch 24 all use PMOS switches, therefore, when reference signal $S_{ref}$ controls first switch 24 and keeps it non-conducting, the inverse reference signal $S_{ref}$ will conduct fifth switch 34, meanwhile, the conducting of fifth switch 34 and sixth switch 36 will generate charging path for a charging action performed by voltage-controlled oscillator 16, that is, the charging behavior.

FIG. 4C is the electrical diagram for discharging action of phase-controlled current source 12. As seen in the preparation action of FIG. 4A and the discharging action of FIG. 4C, take FIG. 4C as an example, when loop signal $S_{fb}$ controls fourth switch 30 and makes it conducting, the second switch 26 will then be non-conducting, however, reference signal $S_{ref}$ will be remained at the same status as the preparation action to control and make first switch 24 conducting and third switch 28 non-conducting, therefore, the potential of node Y will still be remained at the potential of high voltage side VDD, hence, sixth switch 36 and seventh switch 38 will be remained at conducting. Here eighth switch 40 and fourth switch 30 are all NMOS switches, therefore, when loop signal $S_{fb}$ controls fourth switch 30 and makes it non-conducting, eighth switch 40 will then be controlled by loop signal $S_{fb}$ and becomes conducting, meanwhile, the conducting of seventh switch 38 and eighth switch 40 will generate a discharging path to voltage-controlled oscillator 16 for performing discharging action, that is, for performing discharging action.

FIG. 4D is the electrical diagram for stop action of phase-controlled current source 12. After the charging action of FIG. 4B or the discharging action of FIG. 4C is performed by phase-controlled current source 12, a stop action will be performed by FIG. 4D so as to perform charging action or discharging action.

In FIG. 4D, reference signal $S_{ref}$ and loop signal $S_{fb}$ will make first switch 24 and second switch 26 non-conducting respectively and make third switch 28 and fourth switch 30 conducting, therefore, the node Y of second switch 26 and third switch 28 will be at the potential of low voltage side GND, in other words, during the stop action, it is to convert node Y from the potential of VDD to the potential GND of low voltage side, then an energy-triggering/energy-removing signal $S_{con}$ is generated by first inverter 32 to make sixth switch 36 non-conducting and an inverse energy-triggering/energy-removing signal $\overline{S_{con}}$ is generated by third inverter 44 to make seventh switch 38 non-conducting. When sixth switch 36 and seventh switch 38 is made non-conducting, the charging or discharging path will be terminated and the stop action of phase-controlled current source 12 will then be achieved.

In FIG. 4A to FIG. 4D, phase-controlled current source 12 will achieve in the same time the effect of phase frequency detection and charge pump. We know from the above descriptions that in controllable current source 22, fifth switch 34, sixth switch 36, seventh switch 38 and eighth switch 40 can not be made conducting at the same time, power consumption of electrical circuit can then be saved, meanwhile, in the charging and discharging path, the issue of inequality between charging current and discharging current can then be prevented. Additionally, we know from the above charging and discharging behavior of phase-controlled current source, no rising or descending impulse signal needs to be used in the action process of electrical circuit, therefore, the detection dead zone problem due to small pulse width in the structure of prior art phase frequency detector and charge pump can then be avoided.

The entire circuit for the phase-controlled current source of the current invention is very simple which can make the electrical layout simple and eliminate parasitic effect. Moreover, in the prior art phase frequency detector, the reference signal and loop signal in the input end have to be converted into pulse wave for output, therefore, a feedback path has to be used and the detection dead zone problem is thus generated in the prior art phase-locked loop. However, the phase-controlled current source proposed in the current invention comprising of a status memory and controllable current source. Status memory receives reference signal and loop signal so as to generate an energy-triggering/energy-removing signal and the energy-triggering/energy-removing signal together with reference signal or loop signal will decide the charging path or discharging path of controllable current source so as to perform charging or discharging behavior, the conventional detection dead zone problem resulted from small pulse width can thus be avoided. Additionally, the electrical circuit is small and no feedback mechanism is needed to be adopted, therefore, the circuit operation frequency can be greatly enhanced.

Although a better embodiment of the current invention has been disclosed as above, however, it is not used to limit the current invention, anyone who is familiar with the prior art can thus make any kind of change and modification without deviating the spirit and scope of the current invention, therefore, the applicable scope of the current invention should be based on the attached what is claimed.

BRIEF DESCRIPTION OF THE DRAWINGS

In order to let the above descriptions, purposes, advantages and embodiments of the current invention be better understood, the accompanied figures are described in detail as in the followings.

SYMBOL DESCRIPTIONS OF MAJOR COMPONENT

Figure 1:
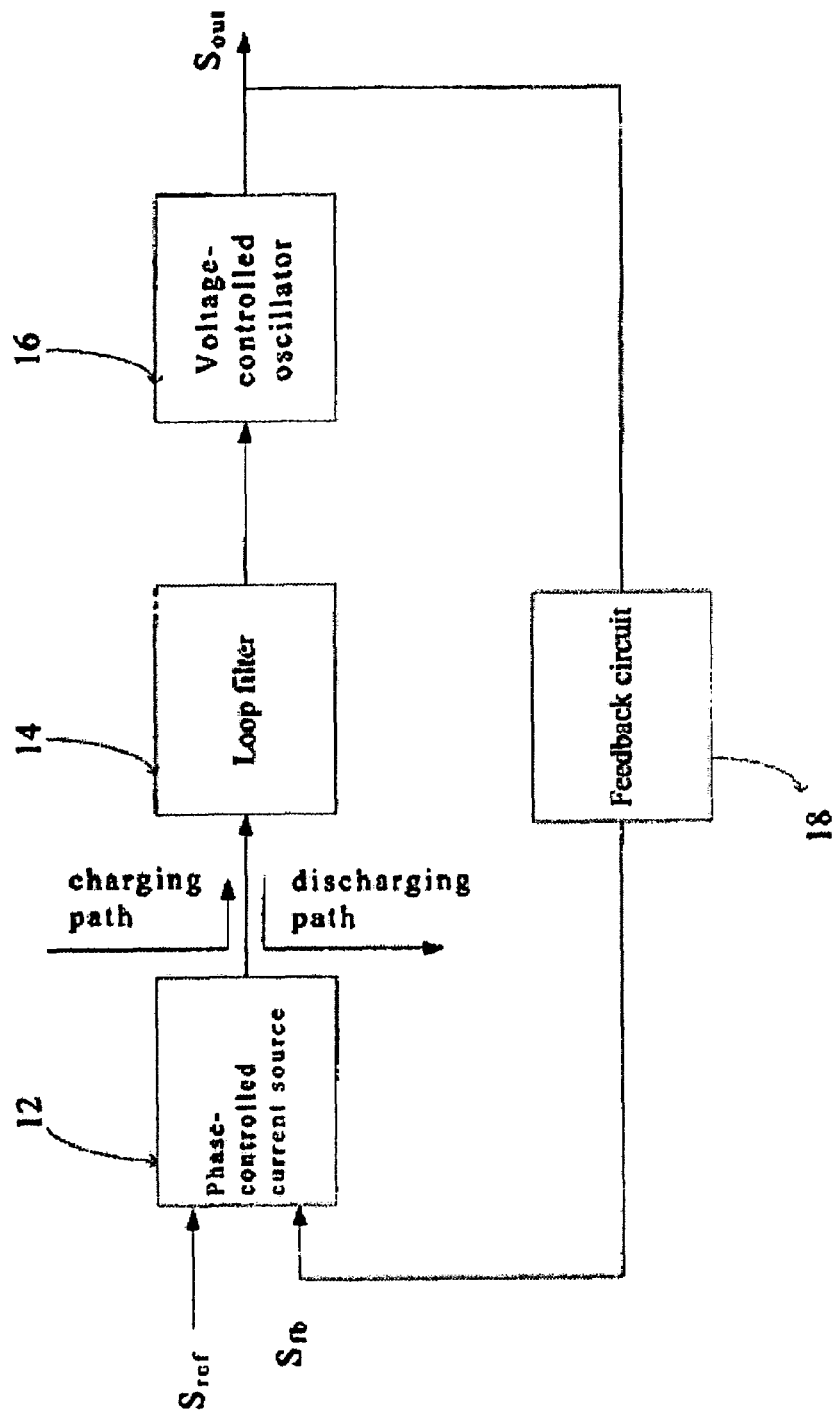
FIG. 1 illustrates the basic structure of phase-locked loop 1 of the current invention.
Figure 2:
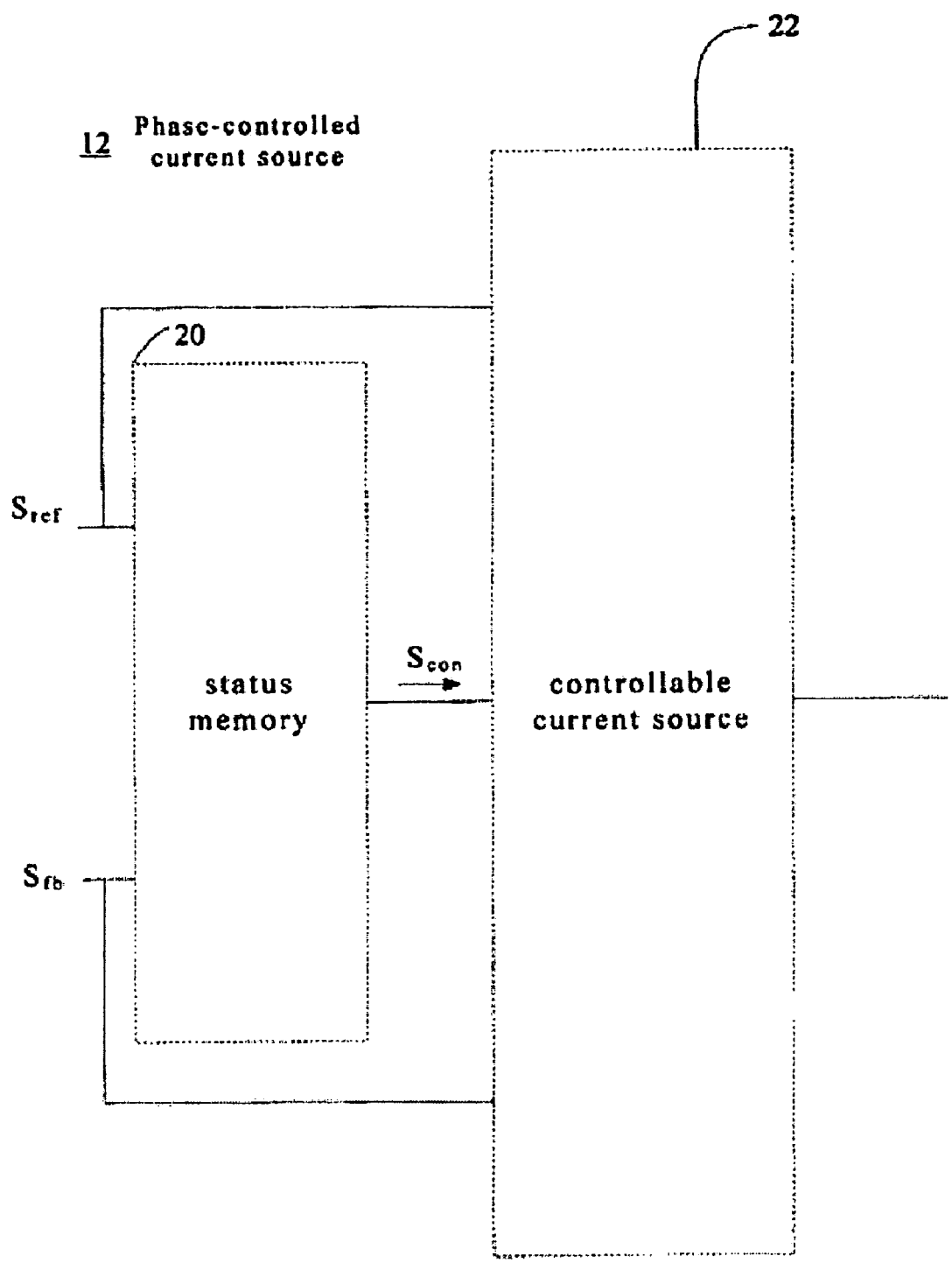
FIG. 2 illustrates the basic structure of phase-controlled current source of the current invention.
Figure 3:
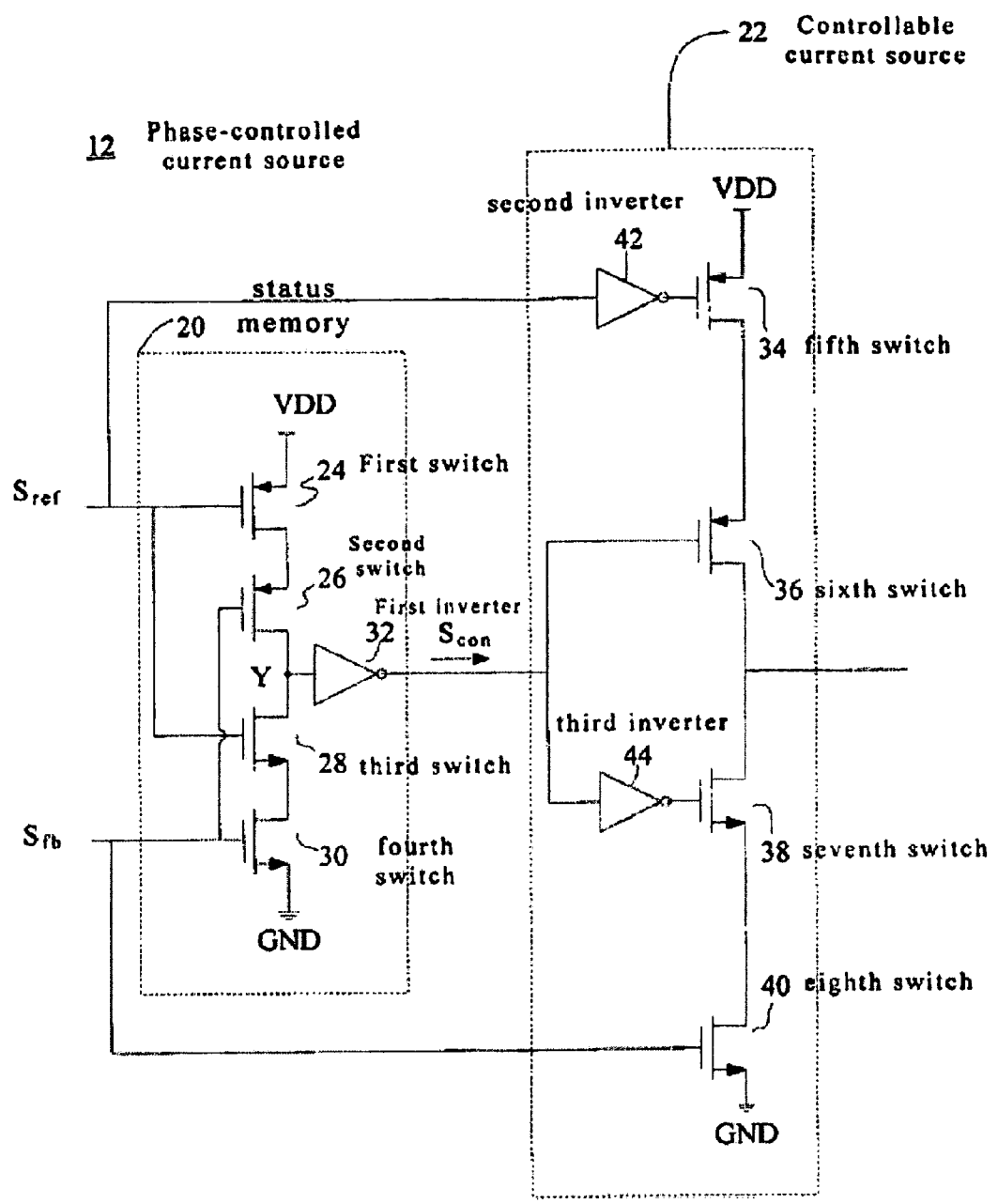
FIG. 3 illustrates the electrical circuit diagram of phase-controlled current source of the current invention.
Figure 4A:
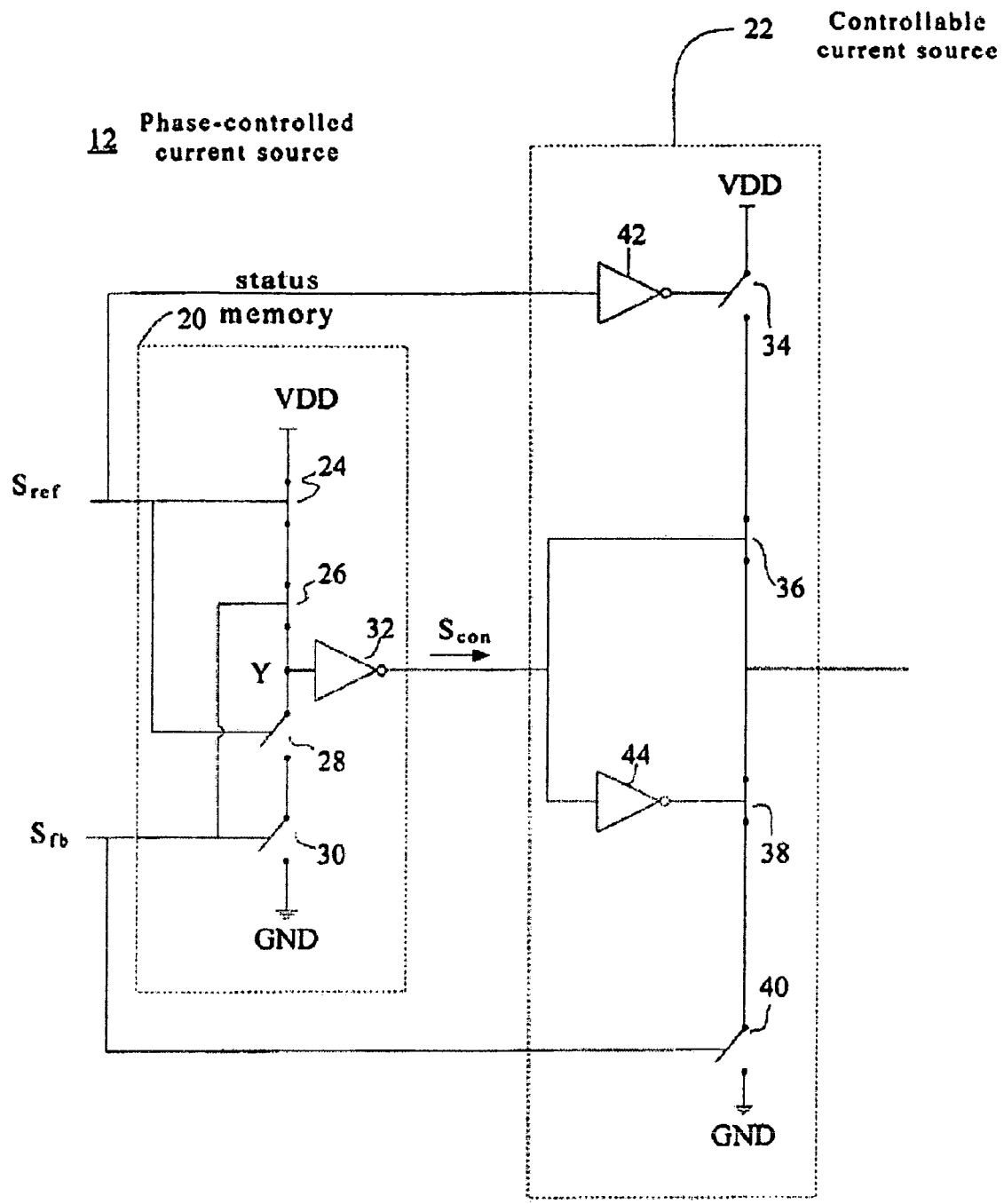
FIG. 4A~4D illustrates the action electrical circuit diagram of phase-controlled current source of the current invention.
Figure 4B:
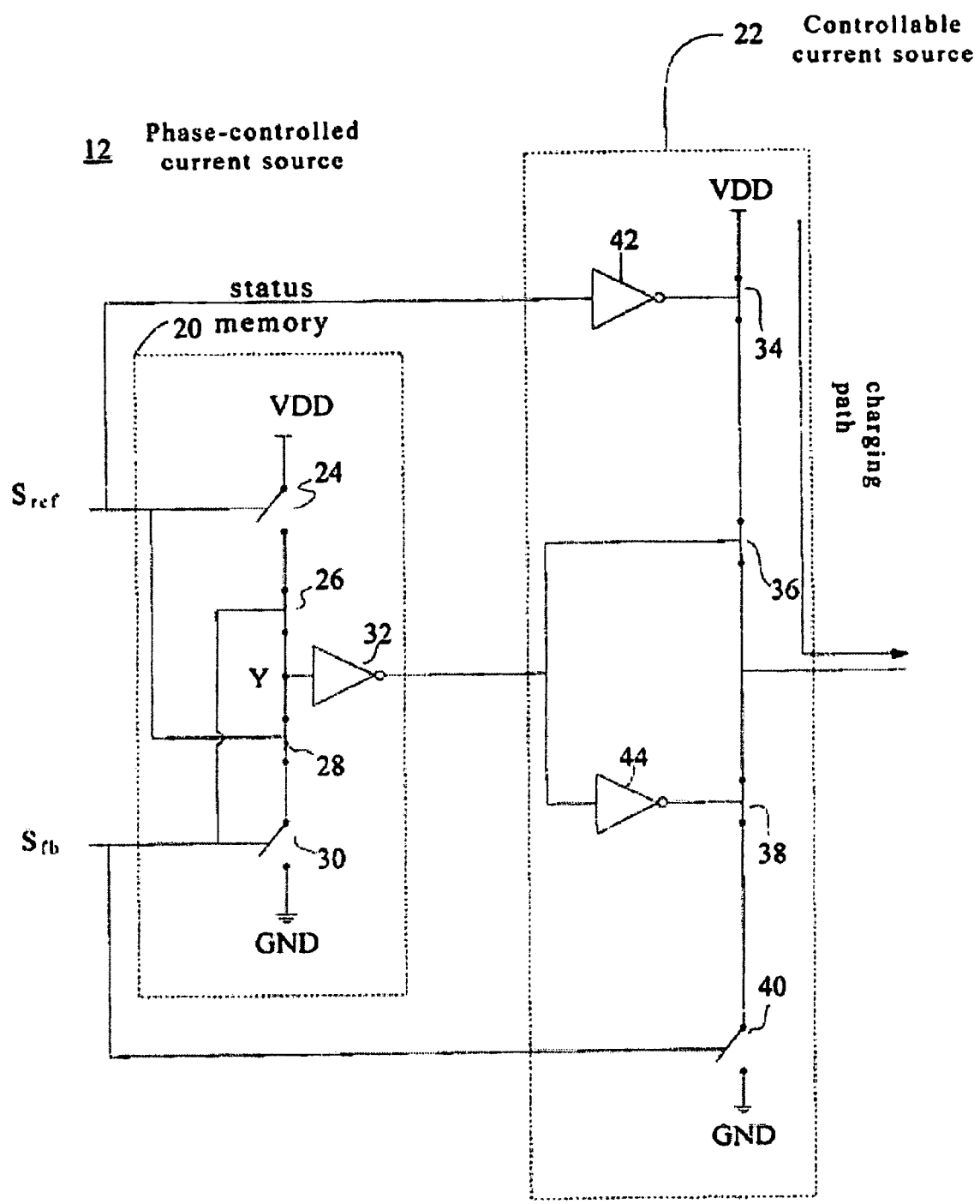
Figure 4C:
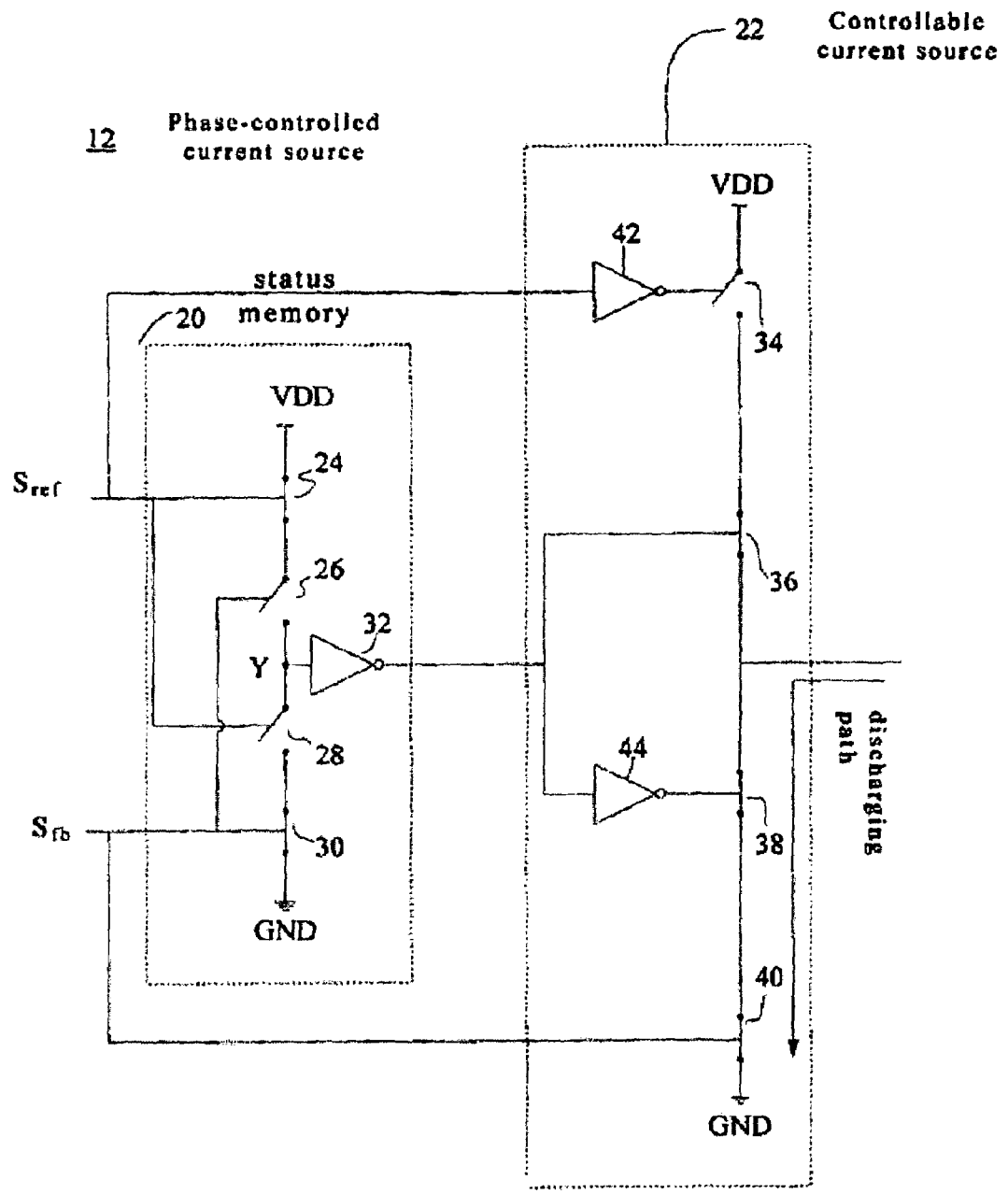
Figure 4D:
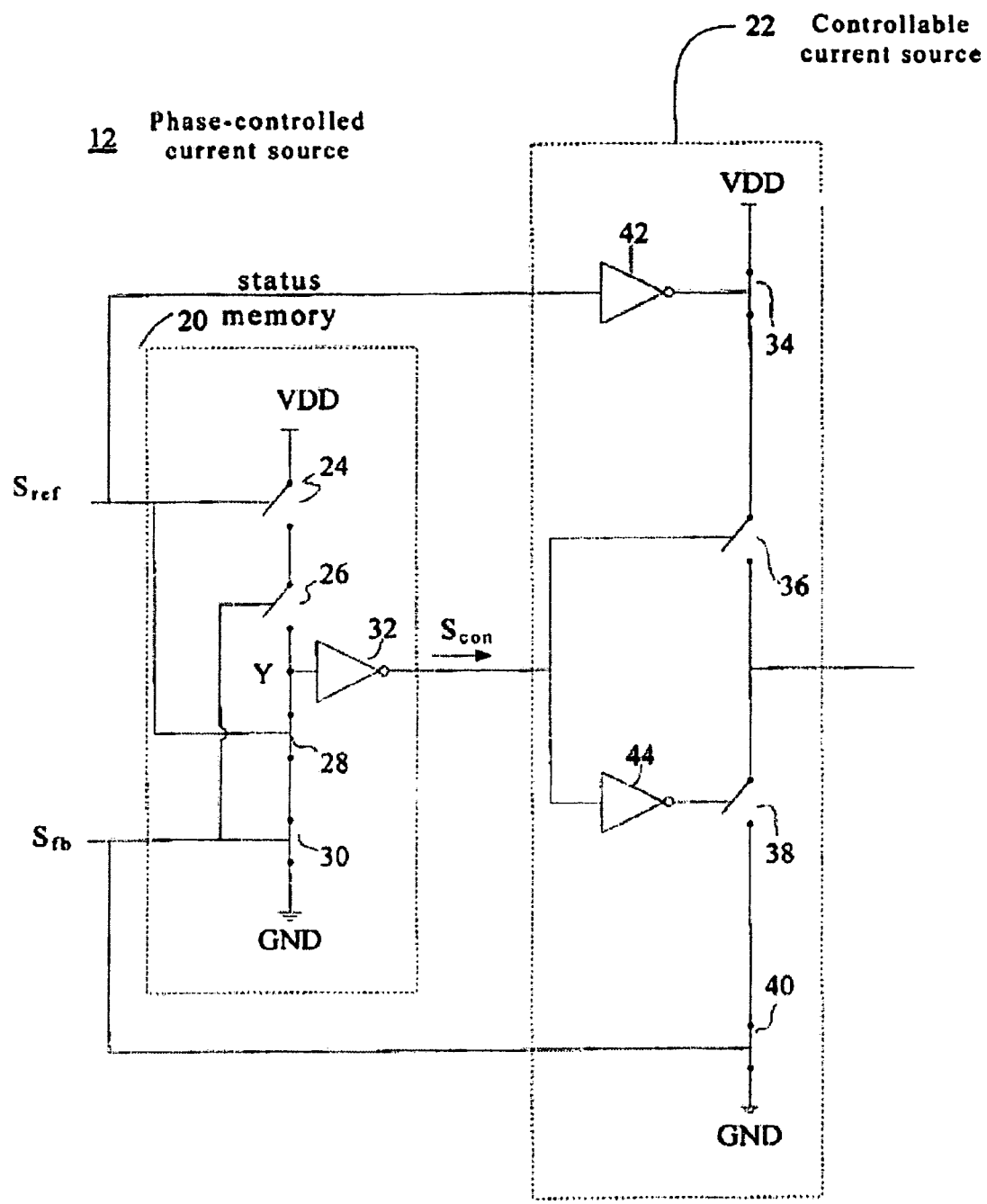

1: phase-locked loop
10: phase-locked loop
12: phase-controlled current source
14: loop filter
16: voltage-controlled oscillator
18: feedback circuit
20: status memory
22: controllable current source
24: first switch
26: second switch
28: third switch
30: fourth switch
32: first inverter
34: fifth switch
36: sixth switch
38: seventh switch
40: eighth switch
42: second inverter
44: third inverter

What is claimed is:

1. A phase-controlled current source for a phase-locked loop, wherein the phase-locked loop comprises a voltage-controlled oscillator to associate a charging path or discharging path to generate an output signal, and the output signal is sensed so as to generate a loop signal, the phase-controlled current source comprising:

a status memory receiving the loop signal and a reference signal so as to output an energy-triggering/energy-removing signal; and a controllable current source, under the control by energy-triggering/energy-removing signal so as to decide whether a charging and discharging action should be performed, wherein after the charging action or discharging action is decided, the charging path or the discharging path is generated through the reference signal and the loop signal, wherein the status memory comprises a first switch, a second switch, a third switch and a fourth switch, which are serially connected between a high and low voltage side, wherein the reference signal is connected to the first switch and the third switch and the loop signal is connected to the second switch and the fourth switch, and wherein through the conducting of the non-conducting of the first switch, the second switch, the third switch and the fourth switch will output an energy-triggering/energy-removing signal between the second switch and the third switch.

2. The phase-controlled current source for a phase-locked loop of claim 1, wherein each of the first switch and the second switch is a PMOS switch.

3. The phase-controlled current source for a phase-locked loop of claim 1, wherein each of the third switch and the fourth switch is a NMOS switch.

4. The phase-controlled current source for a phase-locked loop of claim 1, further comprising a first inverter having an input end connected to between the second switch and the third switch so as to output the energy-triggering/energy-removing signal.

5. A phase-controlled current source for a phase-locked loop, wherein the phase-locked loop comprises a voltage-controlled oscillator to associate a charging path or discharging path to generate an output signal, and the output signal is sensed so as to generate a loop signal, the phase-controlled current source comprising:

a status memory receiving the loop signal and a reference signal so as to output an energy-triggering/energy-removing signal; and a controllable current source, under the control by energy-triggering/energy-removing signal so as to decide whether a charging and discharging action should be performed, wherein after the charging action or discharging action is decided, the charging path or the discharging path is generated through the reference signal and the loop signal wherein the controllable current source comprises a fifth switch, a sixth switch, a seventh switch and an eighth switch, which are serially connected between high and low voltage side, wherein these switches are controlled respectively by the inverse said reference signal, the energy-triggering/energy-removing signal, the reverse said energy-triggering/energy-removing signal and the loop signal so as to output the charging path or the discharging path between the sixth switch and the seventh switch, and wherein when the energy-triggering/energy-removing signal and the inverse said energy-triggering/energy-removing signal conduct the sixth switch and the seventh switch respectively in order to decide to perform the charging or discharging action, the charging path will be generated through the conducting of the fifth switch by the inverse said reference signal and the discharging path will be generated through the conducting of the eighth switch by the loop signal.

6. The phase-controlled current source for a phase-locked loop of claim 5, wherein each of the fifth switch and the sixth switch is a PMOS switch.

7. The phase-controlled current source for a phase-locked loop of claim 5, wherein each of the seventh switch and the eighth switch is a NMOS switch.

8. The phase-controlled current source for a phase-locked loop of claim 5, further comprising a second inverter having an input end connected to the reference signal so as to output the inverse said reference signal.

9. The phase-controlled current source for a phase-locked loop of claim 5, further comprising a third inverter having an input end connected to the energy-triggering/energy-removing signal so as to output the inverse said energy-triggering/energy-removing signal.

10. A phase-locked loop, comprising:

a voltage-controlled oscillator associating with a charging path or a discharging path to generate an output signal;

a feedback circuit to sense the output signal in order to generate a loop signal; and a phase-controlled current source, under control by the loop signal and a reference signal so as to generate the charging path or the discharging path, wherein the phase-controlled current source comprises:

a status memory receiving the loop signal and the reference signal in order to output an energy-triggering/energy-removing signal; and a controllable current source, under control by the energy-triggering/energy-removing signal so as to decide whether a charging or discharging action should be performed, wherein after the charging and discharging actions have been decided, the charging or discharging path is generated through the reference signal and the loop signal, wherein the status memory comprises a first switch, a second switch, a third switch and a fourth switch, serially connected between the high voltage and the low voltage side, wherein the reference signal is connected to the first switch and the third switch and the loop signal is connected to the second switch and the fourth switch, then, through the conducting or non-conducting of the first switch, the second switch and the third switch and the fourth switch will then output an energy-triggering/energy-removing signal between the second switch and the third switch.

11. The phase-locked loop of claim 10, wherein the controllable current source comprises a fifth switch, a sixth switch, a seventh switch and an eighth switch, which are serially connected between a high voltage side and a low voltage side, and are under control respectively by the inverse said reference signal, the energy-triggering/energy-removing signal, the inverse said energy-triggering/energy-removing signal and the loop signal so as to output the charging path or the discharging path between the sixth switch and the seventh switch, wherein after the energy-triggering/energy-removing signal and the inverse said energy-triggering/energy-removing signal conduct respectively the sixth switch and the seventh switch so as to decide to perform the charging and discharging actions, the charging path will be generated through the conducting of the fifth switch by the inverse said reference signal and the discharging path will be generated through the conducting of the eighth switch by the loop signal.

12. The phase-locked loop of claim 11, wherein each of the fifth switch and the sixth switch is a PMOS switch.

13. The phase-locked loop of claim 11, wherein each of the seventh switch and the eighth switch is a NMOS switch.

14. The phase-locked loop of claim 11, further comprising a second inverter having an input end connected to the reference signal so as to output the reverse said reference signal.

15. The phase-locked loop of claim 11, further comprising a third inverter having an input end connected to the energy-triggering/energy-removing signal so as to output the inverse said energy-triggering/energy-removing signal.

16. The phase-locked loop of claim 10, wherein each of the first switch and the second switch is a PMOS switch.

17. The phase-locked loop of claim 10, wherein each of the third switch and the fourth switch is a NMOS switch.

18. The phase-locked loop of claim 10, wherein the feedback circuit is a frequency divider.

19. The phase-locked loop of claim 10, further comprising a loop filter having an input end connected to the charging path or the discharging path and having an output end connected to the voltage-controlled oscillator.

20. The phase-locked loop of claim 10, further comprising a first inverter having an input end connected between the second switch and the third switch so as to output the energy-triggering/energy-removing signal.

* * * * *